United States Patent [19]

Nolan et al.

[11] Patent Number: 5,016,219
[45] Date of Patent: May 14, 1991

[54] COMPUTER MEMORY WRITE PROTECTION CIRCUIT

[75] Inventors: James B. Nolan, Phoenix; Jeffrey M. Michelsen, Mesa, both of Ariz.

[73] Assignee: VLSI Technology, Inc., San Jose, Calif.

[21] Appl. No.: 478,609

[22] Filed: Feb. 12, 1990

[51] Int. Cl.$^5$ ............................................... G11C 7/00
[52] U.S. Cl. ...................................... 365/195; 365/228
[58] Field of Search .................. 365/189.01, 194, 195, 365/226, 228, 229, 230.08; 307/272.2

[56] References Cited

U.S. PATENT DOCUMENTS 4,327,410  4/1982  Patel et al. .......................... 365/228
4,580,240  4/1986  Sibigtroth ........................... 365/194

Primary Examiner—Stuart N. Hecker
Assistant Examiner—Jack A. Lane
Attorney, Agent, or Firm—LaValle D. Ptak

[57] ABSTRACT

A write protection circuit for the Real Time Clock (RTC) Random Access Memory (RAM) of a computer prevents the writing of data into the RTC RAM in the event of a power supply interruption, including write operations which are in progress during removal or interruption of the power supply. This is accomplished by latching both the address and the data in a buffer instead of connecting the respective address and data buses directly to the destination address location in the RTC RAM. In addition, once the data is buffered, the actual write signal to the internal destination of the RTC RAM is delayed until termination of the write strobe pulse. Once the write strobe pulse is terminated; and, additionally, if no power supply interruption has occurred during the latching of the data, an asynchronous monostable multivibrator generates a delayed write strobe which is used to transfer the latched data to the RTC RAM.

17 Claims, 2 Drawing Sheets

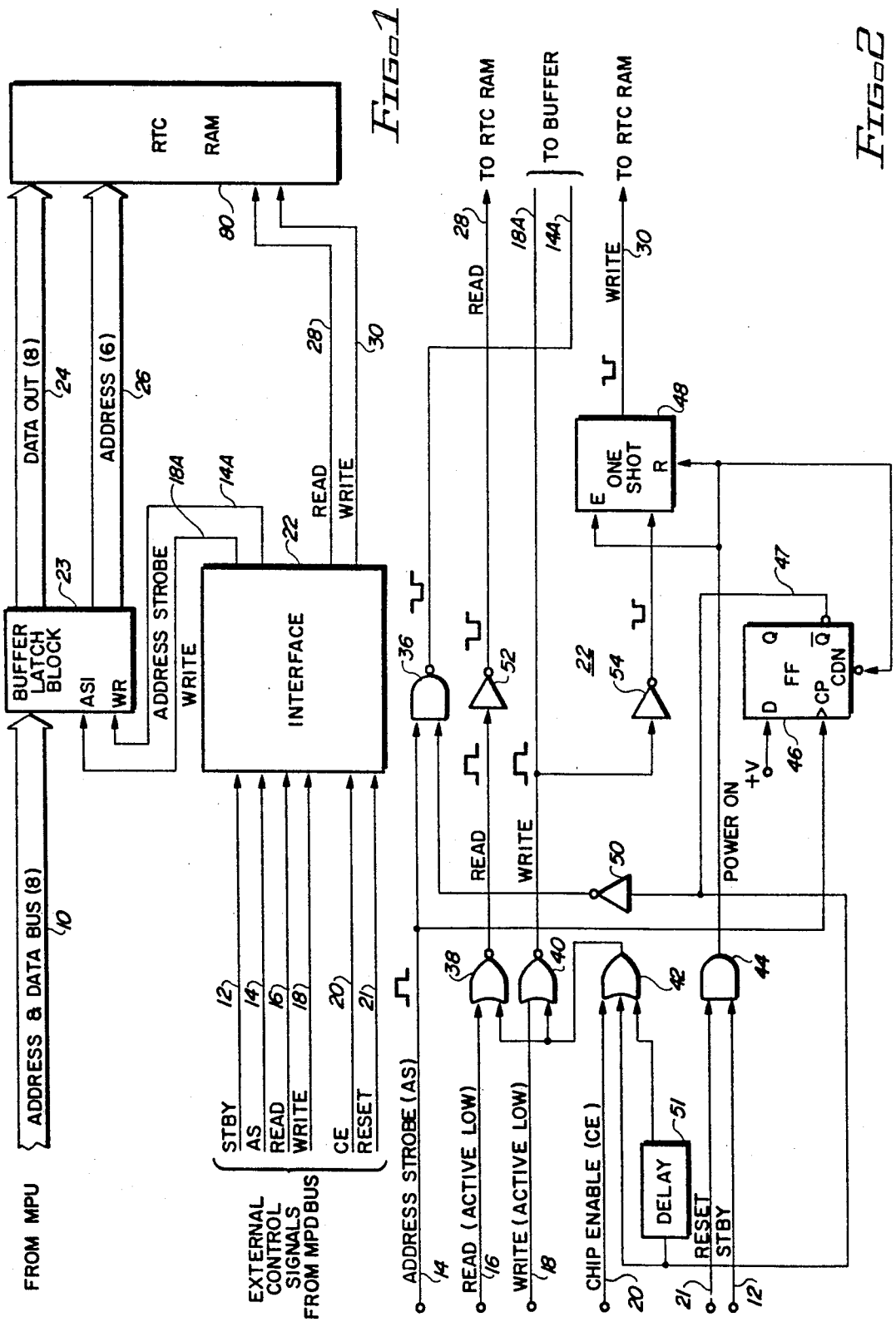

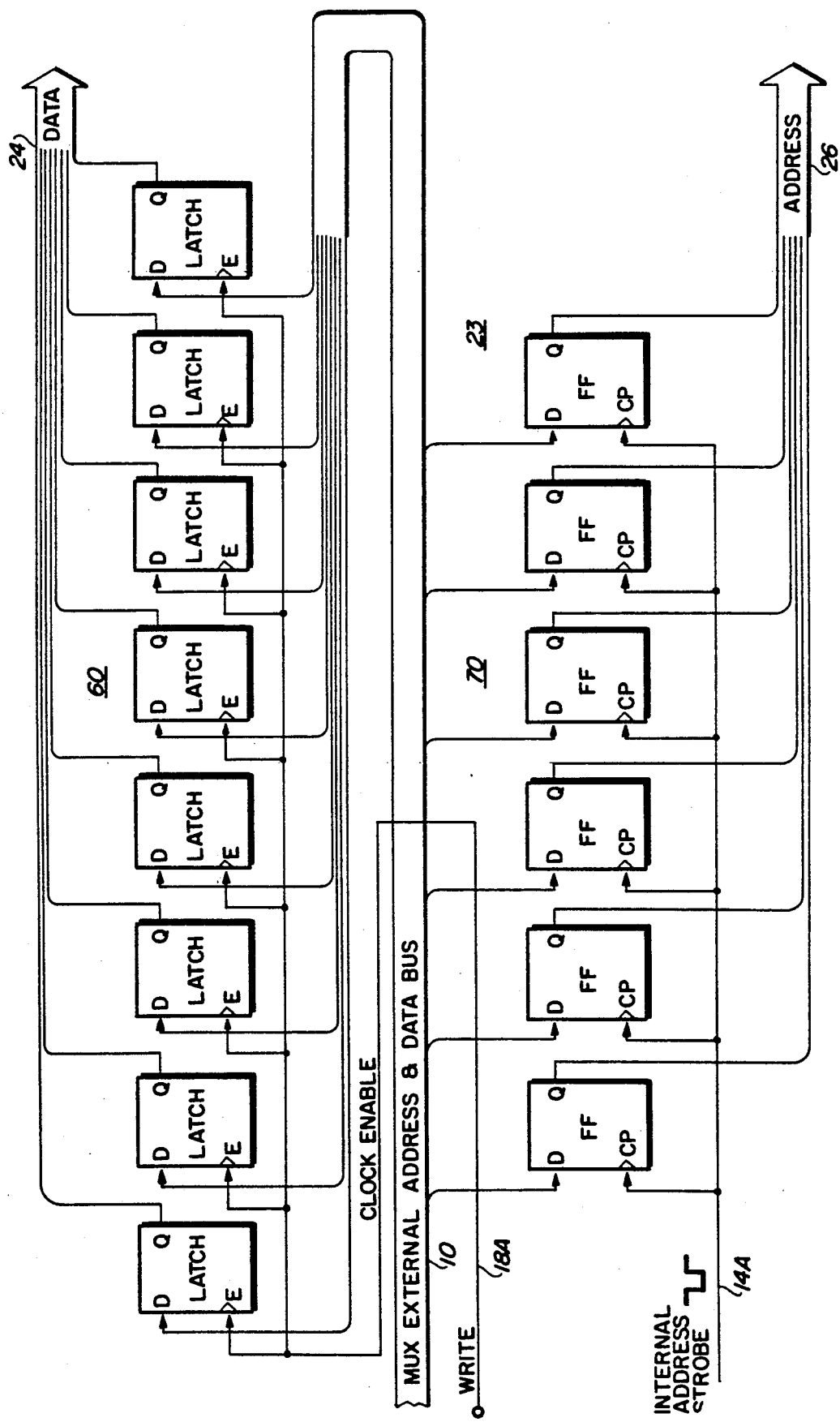

COMPUTER MEMORY WRITE PROTECTION CIRCUIT

BACKGROUND

Microprocessors, microcomputers and larger computers frequently utilize a peripheral device or a built-in circuit known as a Real Time Clock (RTC) plus RAM circuit (RTC RAM). Such a part typically provides complete time of day and long term calendar information, as well as critical system constants for use in the computer. Generally, a Real Time Clock is operated from the primary computer power supply. In addition, the RTC is provided with battery back-up; so that the timekeeping and calendar functions of the clock are not lost in the event that the main power is turned off or interrupted. Two popular peripheral RTC devices for providing such functions are the Motorola MC146818A and the Dallas Semiconductor DS1287. These parts are widely used with popular personal computers made by various manufacturers.

Whether an RTC RAM device is supplied as a peripheral device or is otherwise built into the computer, the processor program for the computer obtains the time and calendar information, and other critical system constants, from the Random Access Memory (RAM) of the RTC device by reading the appropriate address locations in the device in accordance with the processor program. In addition, it is necessary for a provision to be made in the program for initializing or changing the time, calendar and other critical system constants of the RTC device by writing these to various RAM address locations.

Once the information has been initialized, changes are not frequently made by writing to the RTC RAM address location; but updates or writing of new information into the various RTC memory locations can occur at anytime during the operation of the computer. So long as the computer and RTC device are operating under constant power, there is no problem with such writing of information to the RAM address locations in the device.

In the design of RTC devices, special consideration has been given to avoiding data corruption of the battery-backed RAM in such devices by uncontrolled activity on the microprocessor bus during periods of power supply interruption. In normal unprotected designs, the combination of the write strobe and a chip select (RTC select) signal causes data on the data bus of the microprocessor to be written into a destination dictated by the address bus. If the power supply is dropping or turning off during a write access, erroneous data can be written to the destination in the RTC RAM, or data can be written to the wrong destination. Furthermore, if no control is maintained over the address, a number of address locations could be corrupted. Such a situation can occur during power interruption or if the computer processor loses control of its instruction sequence.

In the past, attempts to solve this problem of power supply interruption have incorporated a sensing circuit for producing a "stand-by" or "power-down" mode which prohibits a data transfer whenever this mode is activated. This usually is effected by an off-chip sensor which reflects the integrity of the power supply and directly monitors that power supply. While such a "stand-by" mode of operation is adequate to protect against erroneous data or erroneous addresses for stable power-down situations, no protection is provided against data corruption which can occur in the event the stand-by mode becomes active during a data transfer cycle which already is underway at the time power is interrupted. Such a situation typically results in an aborted write cycle and causes invalid data to be written to the destination address, because the pulse-width or data hold specifications for proper operation of the RTC device are not maintained.

Accordingly, it is desirable to provide address and data protection for an RTC RAM during all power supply modes of operation of the computer with which the device is associated including power-on, power-off, and transient periods of power interruption.

SUMMARY OF THE INVENTION

It is an object of this invention to provide an improved write protection circuit for a computer memory.

It is another object of this invention to provide an improved write protection circuit for a computer Random Access Memory (RAM).

It is another object of this invention to provide a write protection circuit for a Real Time Clock Random Access Memory.

It is a further object of this invention to provide a write protection circuit for a Real Time Clock Random Access Memory which prevents the writing of data to such memory during power interrupts including situations where the power interruption occurs during a write sequence which already has been initiated.

In a preferred embodiment of the invention, an RTC RAM address and data protection circuit is activated by signals from the power supply monitor which provides "power-interrupt" signals to the circuit Both the address and data buses for the RTC RAM are latched instead of connecting these buses directly to the RAM destination address locations in the Real Time Clock (RTC). This permits the transfer of data and the destination address to be controlled by the write protect circuitry. Once the data is latched or buffered, the actual write signals to the internal destination of the RTC RAM are delayed until the write strobe pulse for the system terminates. This delay is provided by a monostable multivibrator. Assuming no power supply interruption has occured, the multivibrator generates the internal write strobe to transfer the latched data to the latched destination address in the RAM. If a power supply interruption occurs, however, the monostable multivibrator is reset; and no delayed write strobe pulse is produced, so that no write information is supplied to the RTC RAM.

BRIEF DESCRIPTION OF THE DRAWINGS

FIG. 1 is a block diagram of a preferred embodiment of the invention;

FIG. 2 is a detailed block diagram of a portion of the circuit of FIG. 1; and

FIG. 3 is a detailed block diagram of another portion of the circuit of FIG. 1.

DETAILED DESCRIPTION

Reference now should be made to the drawings, in which the same reference numbers are used throughout the different figures to designate the same components. In FIG. 1, various inputs are shown on the left-hand side of the figure which represent signals typically present in a computer for supplying addresses and data to a Real Time Clock (RTC) Random Access Memory (RAM) 80, along with various external control signals available for reading and writing data to the RTC RAM 80. The signal outputs shown on the right-hand side of FIG. 1 are those which are supplied to the RTC for this purpose.

Normally, there is a direct interconnection between the inputs on the left-hand side of FIG. 1 directly to the RTC. In the system of a preferred embodiment of this invention, however, all of the various control signals including stand-by (STBY) 12, address strobe (AS) 14, read 16, write 18, chip enable (CE) 20, and reset 21, are connected to corresponding inputs of an interface circuit 22 which then supplies the necessary read and write control signals to the RTC over outputs 28 and 30, respectively.

The interface circuit 22 also supplies a separate address strobe signal and a write signal over leads 14A and 18A to a buffer latch block circuit 23. The multiplex address and data bus 10 from the computer MPU is supplied to the buffer latch block 23, which has a data output bus 24 and an address bus 26 connected to the corresponding data and address inputs of the RTC circuit.

Reference now should be made to FIG. 2 which is a detailed block diagram of the interface circuit 22. Description of the operation of the interface circuit 22, as shown in FIG. 2, first will be made in conjunction with a normal, "power-on", steady state condition of operation. The operation for power interrupt then will be described. For the steady state power-on condition, positive or high inputs are provided from the computer on the stand-by input line 12 and the reset line 21 as two inputs to an AND gate 44. The stand-by (STBY) input 12 is provided from a sensor (not shown) of a standard type which monitors the computer power supply. The input 12 is high at all times the computer power supply is in a "power-up" condition of operation.

Whenever the main computer power supply is interrupted or is turned off, the signal on the stand-by lead 12 drops from a positive or high value to a negative or low value. This occurs during the transition from the system power supply to the backup battery power used for protecting data integrity of the RTC system.

During the normal "power-on" steady state operation of the system, the output from the AND gate 44 enables a one-shot multivibrator 48 for operation. Also, for steady state power-on operation, an initializing flip-flop 46 produces a low or negative signal on its Q/bar output 47 which is applied directly, and through a delay 51, as two inputs to an OR gate 42. The third input to the OR gate 42 is a chip enable input which normally is a low or negative input. As a result, during the steady state "power-on" operation, the output of the OR gate 42 also is negative or low. This output is applied as one input to a pair of NOR gates 38 and 40, the other inputs to which are the read input 16 and the write input 18, respectively, from the computer MPU.

The signals on the inputs 16 and 18 normally are high in the absence of a read or a write command; but whenever a read or write operation is requested from the MPU, the corresponding input 16 or 18 goes low. Since the NOR gates 38 and 40 are enabled by the low or negative output from the OR gate 42, a positive "read" pulse is produced by the NOR gate 38 whenever a negative or low pulse is applied to the read input 16. Similarly, a positive "write" pulse is obtained from the output of the NOR gate 40 whenever a low or negative pulse is applied to the write input lead 18.

Since no problem arises through the application of a read pulse at any time to the RTC RAM, read pulses applied through the NOR gate 38 are inverted by an inverter 52 and applied over an output lead 28 directly to the RTC for utilization by the RTC circuit in a conventional manner to read the data at the selected address. Write pulses, however, from the output of the gate 40 are applied to two different outputs. One of these is the line 18A which is connected to the buffer circuit 22. The other output is connected through an inverter 54 to trigger the monostable multivibrator (one-shot) 48 into operation. As explained previously, the multivibrator 48 is enabled to respond to trigger pulses from the inverter 54 by the power-on signal obtained from the AND gate 44. The multivibrator 48 is set to delay the application of a write pulse over a line 30 to the RTC. Pulses applied to the RTC from the line 30 operate in a conventional manner to write data into the RTC in accordance with the address selected on the address bus 26 and the data applied to the RTC over the data bus 24.

Reference now should be made to FIG. 3 which describes the remainder of the circuit shown in FIG. 1. The data and address designations from the MPU of the computer are supplied over a multiplex bus 10 to a data latch circuit 60 and an address latch circuit 70. As illustrated in FIG. 3, the data latch circuit 60 of the buffer latch block 23 consists of eight stable latches of a type which are enabled (by a signal at input E) to pass through to the "Q" output whatever data is present on the input "D" of the latch. Each latch of the circuit 60 holds the previous signal which was present the last time the latch was enabled until the next enabling signal. The latches are enabled by a The "D" inputs of the flip-flops of the address buffer circuit 70 are provided with the different bits of the byte of address information which is present on the bus 10 at the time an address strobe (AS) signal is applied to the lead 14 (FIGS. 1 and 2). As described in conjunction with FIG. 2, the NAND gate 36 inverts this address strobe pulse. This inverted pulse appears on the lead 14A and is applied to the clock inputs of the six flip-flops of the address buffer circuit 70 to store the address.

The address flip-flops are clocked on the rising edge of the address strobe pulse which appears at the termination of the internal address strobe on the lead 14A. The synchronization of the appearance of the address data on the multiplex bus 10 and the address strobe signal on the lead 14 (FIGS. 1 and 2) is provided by the MPU of the computer in a conventional manner.

Once the write enable signal 18A and the internal address strobe signal 14A have transferred the data and address information to the respective buffer circuits 60 and 70, this information is respectively available on the data bus 24 and the address bus 26. These are connected to the RTC RAM in place of supplying this information directly from the address and data buses of the MPU.

It is apparent that the write pulse 18A causes the transfer of the data information to the latches of the buffer latch circuit 60 prior to the appearance of the delayed write pulse on the lead 30 from the output of the one-shot multivibrator 48. Thus, the data information is stored in the stable buffer latch "high" or positive pulse or signal and are disabled or revert to the holding condition of operation whenever the input applied to the "E" inputs of the various latches in the circuit 60 is "low" or negative.

Synchronization of the availability of data to be written to the RTC with the write pulses applied on the lead 18 from the MPU is accomplished in a conventional manner for operation of such circuits. Consequently, when a write pulse is applied to the lead 18, it is inverted by the NOR gate 40, as described previously, and is applied as a positive pulse on the lead 18A. This lead is connected in parallel to all of the "E" inputs of the latches of the latch circuit 60. This enables the latches to respond to the parallel data bits of the data byte present on the data bus 10 at that time to cause each of the latches of the circuit 60 to store the corresponding bit of data in the data byte. Upon termination of the write clock pulse, the signal on the lead 18A reverts back to its "low" or steady state condition and the latches of the latch circuit 60 store the data which was present at the "D" inputs at the time the write pulse appeared on the lead 18A. Thus, the data to be supplied to the RTC RAM is stored or buffered in the latch circuit 60 and is present in parallel from the "Q" outputs of the latches on the data bus 24. This data cannot change until the next write pulse appears on the input 18 from the MPU.

Similarly, the address also is buffered or temporarily stored in six buffer flip-flops of an address buffer circuit 70. 60 prior to the application of the write pulse on the lead 30 to the RTC. Similarly, the address also is stored in the buffer flip-flop circuit 70; so that when the write pulse appears on the lead 30, no changing address or data information is possible, even in the event of a power loss. There always is a delay between the storing of the data and address information in the buffers 60 and 70 and the application of a write pulse over the lead 30 to the RTC.

If the main power supply should be turned off or interrupted prior to any attempted writing of information into the RTC, this condition is effected by a "low" input on the standby line 12 from the computer; and this signal is applied to one of the inputs of the AND gate 44. A similar result is achieved any time a reset of the system is desired by the application of a "low" input on the line 21, which comprises the second input to the AND gate 44. Thus, as soon as the computer operating power is turned off or interrupted, the power line monitor (standard, not shown) which provides the input on the standby lead 12 produces this changed input.

Thus, upon power interruption, the output of the AND gate 44 immediately drops from a "high" output to a "low" output; and this pulse transistion is applied to the reset input of the one-shot multivibrator 48 and to the reset input of the flip-flop 46. In addition, this "low" output is applied to the enabling input of the one-shot multivibrator 48 to prevent the multivibrator 48 from responding to any subsequent write pulses applied to its input from the output of the inverter 54.

When the state of the flip-flop 46 is reset or changed, its output is applied through the inverter 50 to disable the gate 36. In addition, the two inputs to the OR gate 42 switch from "low" to "high". This causes the output of the OR gate 42 to be high, thereby disabling the NOR gates 38 and 40, forcing the outputs of these two gates to be held to a low condition. The inverted output applied to the NAND gate 36 from the inverter 50 is low, which forces the output of the NAND gate 36 to be high. The result is that no internal address strobe pulses subsequently can appear on the lead 14A, and no write pulses will appear on the lead 18A, irrespective of the appearance of such pulses on the inputs 14 and 18. This condition will remain as long as the input on the lead 12 indicates that main line power no longer is present or has been interrupted.

It should be noted that if power interruption occurs after the application of an internal address strobe pulse on the lead 14A to set the address into the address buffer flip-flops 70, and after the application of a write pulse over the lead 18A to set data into the data latches of the buffer 60, but before the delayed write pulse 30 from the output of the multivibrator 48 appears, the reset pulse which is obtained from the output of the AND gate 44 interrupts or terminates the operation of the one-shot multivibrator 48. Thus, no delayed write pulse is applied to the RTC circuit. Consequently, during a situation where the power supply is changing from the main power supply to the backup battery supply, no data can be written to any address of the RTC since this is a situation where, because of the change in power, data corruption frequently can occur.

On return from power supply interruption, it is necessary first for a valid address strobe signal to be applied to the input 14 following or in conjunction with a power-on condition (both inputs to the AND gate 44 "high"). This then triggers the flip-flop 46 back to the condition of operation where the gates 42 and 36 are enabled to permit normal bus access for the system. As stated previously, the power-on output from the AND gate 44 also enables the one-shot multivibrator 48 for its operation to produce delayed write pulses on the lead 30.

It is apparent from the foregoing description that any "write" to or "read" from the RTC are immediately terminated in the event of a power supply interruption. In addition, the system prevents any address strobes from taking place, maintaining the address to the last value latched in the buffer latch circuit 70 of the buffer 23. As further protection, the system also could be used to force the internal address in the buffer 70 to some unused destination value. Any time the reset or standby inputs 21 and 12 are low, the gate 44 prevents operation of the one-shot multivibrator 48, so no internal write strobe signals are applied to the lead 30, irrespective of inputs appearing on the write input terminal 18.

The foregoing description of the preferred embodiment of the invention is to be considered illustrative of the invention and not as limiting. Various changes and modifications will occur to those skilled in the art without departing from the true scope of the invention. Different arrangements of gates can be used depending upon the system logic chosen. Instead of employing a monostable one-shot multivibrator, the write pulse delay and its termination may be effected with different circuitry. Flip-flops may be used in the latch circuit 60 instead of the latches which have been described, without departing from the true scope of the invention as defined in the appended claims.

We claim:

1. A write protection circuit for preventing implementation of a memory write cycle for a memory when a power interruption occurs, said circuit including in combination:

data supply means for supplying data signals to be stored in a memory;

power monitor means for producing a power loss signal in response to power interruption;

first buffer means coupled with said data supply means for temporarily storing data signals therein and for providing such stored data signals on the output thereof to the memory for storage therein;

delay circuit means with an input and an output;

a source of write pulses coupled with said first buffer means for causing the storage of data signals present from said data supply means therein at the time of occurrence of said write pulses, and further coupled with the input of said delay circuit means, the output of said delay circuit means supplying delayed write pulses to the memory for effecting storage therein of the data signals on the output of said first buffer means of the time of occurrence of said delayed write pulses; and means coupled with said power monitor means and said delay circuit means for preventing said delay circuit means from supplying delayed write pulses to the memory in response to a power loss signal from said power monitor means.

2. The write protection circuit of claim 1 wherein said first buffer means comprises latch circuit means enabled to store data signals supplied thereto from said data supply means in response to write pulses from said source of write pulses.

3. The write protection circuit of claim 2 wherein said delay circuit means comprises a monostable multivibrator triggered from a stable condition to an astable condition by pulses from said source of write pulses for producing a delayed write pulse a predetermined time after the application of a write pulse thereto, said monostable multivibrator being set to its stable condition upon the application to a reset input thereof of a power loss signal from said power monitor means.

4. The write protection circuit of claim 3 further including address supply means for supplying address signals to the memory; and second buffer means coupled with said address supply means for temporarily storing address signals therein and for providing such stored address signals on an output thereof to the memory.

5. The write protection circuit of claim 4 wherein said second buffer means comprises a plurality of bistable means and wherein said first buffer means comprises a plurality of latch circuit means.

6. The write protection circuit of claim 5 wherein said address supply means and said data supply means comprise a common multiplex address and data bus.

7. The write protection circuit of claim 5 wherein the memory is a random access memory of a real time clock (RTC) system.

8. The write protection circuit of claim 5 further including a source of address strobe pulses coupled with said second buffer means for causing the storage of address signals supplied thereto from said address supply means and further including means for preventing the application of address strobe pulses to said second buffer means in response to power loss signal from said power monitor means.

9. The write protection circuit of claim 1 wherein said delay circuit means comprises a monostable multivibrator triggered from a stable condition to an astable condition by pulses from said source of write pulses for producing a delayed write pulse a predetermined time after the application of a write pulse thereto, said monostable multivibrator being set to its stable condition upon the application to a reset input thereof of a power loss signal from said power monitor means.

10. The write protection circuit of claim 1 wherein the memory is a random access memory of a real time clock (RTC) system.

11. The write protection circuit of claim 1 further including address supply means for supplying address signals to the memory; and second buffer means coupled with said address supply means for temporarily storing address signals therein and for providing such stored address signals on an output thereof to the memory.

12. The write protection circuit of claim 11 wherein said second buffer means comprises a plurality of bistable means and wherein said first buffer means comprises a plurality of latch circuit means.

13. The write protection circuit of claim 12 further including a source of address strobe pulses coupled with said second buffer means for causing the storage of address signals supplied thereto from said address supply means and further including means for preventing the application of address strobe pulses to said second buffer means in response to power loss signal from said power monitor means.

14. The write protection circuit of claim 11 wherein said address supply means and said data supply means comprise a common multiplex address and data bus.

15. The write protection circuit of claim 14 wherein the memory is a random access memory of a real time clock (RTC) system.

16. The write protection circuit of claim 14 wherein said first buffer means comprises latch circuit means enabled to store data signals supplied thereto from said data supply means in response to write pulses from said source of write pulses.

17. The write protection circuit of claim 16 wherein said delay circuit means comprises a monostable multivibrator triggered from a stable condition to an astable condition by pulses from said source of write pulses for producing a delayed write pulse a predetermined time after the application of a write pulse thereto, said monostable multivibrator being set to its stable condition upon the application to a reset input thereof of a power loss signal from said power monitor means.

* * * * *